(12) United States Patent
Audet et al.

(10) Patent No.: US 7,786,579 B2
(45) Date of Patent: Aug. 31, 2010

(54) APPARATUS FOR CRACK PREVENTION IN INTEGRATED CIRCUIT PACKAGES

(75) Inventors: Jean Audet, Granby (CA); Anson J. Call, Poughkeepsie, NY (US); Steven P. Ostrander, Poughkeepsie, NY (US); Douglas O. Powell, Endicott, NY (US); Roger D. Weekly, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 435 days.

(21) Appl. No.: 11/752,449

(22) Filed: May 23, 2007

(65) Prior Publication Data

US 2008/0290510 A1    Nov. 27, 2008

(51) Int. Cl.
*H01L 23/48*   (2006.01)
*H01L 23/52*   (2006.01)
*H01L 29/40*   (2006.01)

(52) U.S. Cl. ............... 257/737; 257/734; 257/E23.019; 257/E23.06

(58) Field of Classification Search ................ 257/737, 257/734, E23.019, E23.06
See application file for complete search history.

(56) References Cited

U.S. PATENT DOCUMENTS

| | | | |
|---|---|---|---|
| 5,583,378 A * | 12/1996 | Marrs et al. ................. | 257/710 |
| 6,762,498 B1 * | 7/2004 | Morrison et al. ............ | 257/758 |
| 7,173,342 B2 * | 2/2007 | Tay et al. .................... | 257/786 |
| 7,355,279 B2 * | 4/2008 | Ke et al. ...................... | 257/737 |
| 2005/0057908 A1 * | 3/2005 | Egitto et al. ................ | 361/795 |
| 2006/0009023 A1 * | 1/2006 | Nair et al. ................... | 438/614 |
| 2006/0220229 A1 * | 10/2006 | Chambers .................... | 257/723 |
| 2006/0246706 A1 * | 11/2006 | Ke et al. ...................... | 438/613 |
| 2007/0212867 A1 * | 9/2007 | Chen et al. .................. | 438/613 |

OTHER PUBLICATIONS

E. D. Blackshear, et al; The Evolution of Build-up Package Technology and Its Design Challenges; IBM J. Research & Development. vol. 49; No. 4/5.
George A. Riley; "Introduction to Flip Chip: What, Why, How" [online]; [retrieved on Apr. 9, 2007]; retrieved from the Internet http://www.flipchips.com/tutorial01.htm.
Christopher R. Newman, et al.; "Introduction to Organic Thin Film Transistors and Design of n-Channel Organic Semiconductors"; Chem. Mater. 2004, vol. 16, No. 23; pp. 4436-4451.
René A.J. Janssen, et al.; "Polymer-Fullerene Bulk Heterojunction Solar Cells"; MRS Bulletin; vol. 30; Jan. 2005; pp. 33-36.
Advanced Surface Technology Exhibition & Conference ASTEC2007; Feb. 21-23, 2007.

* cited by examiner

*Primary Examiner*—Thanh V Pham
*Assistant Examiner*—Duy T Nguyen
(74) *Attorney, Agent, or Firm*—Cantor Colburn LLP; Wenji Li

(57) ABSTRACT

A microelectronic package having integrated circuits is provided. The microelectronic package includes multiple dielectric laminate layers, copper circuitry between the dielectric laminate layers where the copper circuitry includes circuit traces, and ball grid arrays/land grid arrays operatively connected to the copper circuitry such that conduction occurs. Further, proximate to the connection of the copper circuitry and the ball grid arrays/land grid arrays, a protective copper tongue is below an extension of the circuit traces, such that the protective copper tongue prevents the circuit traces from being affected by cracking propagated in the dielectric laminate layers or the ball grid arrays/land grid arrays.

4 Claims, 3 Drawing Sheets

APPARATUS FOR CRACK PREVENTION IN INTEGRATED CIRCUIT PACKAGES

TRADEMARKS

Figure 1:
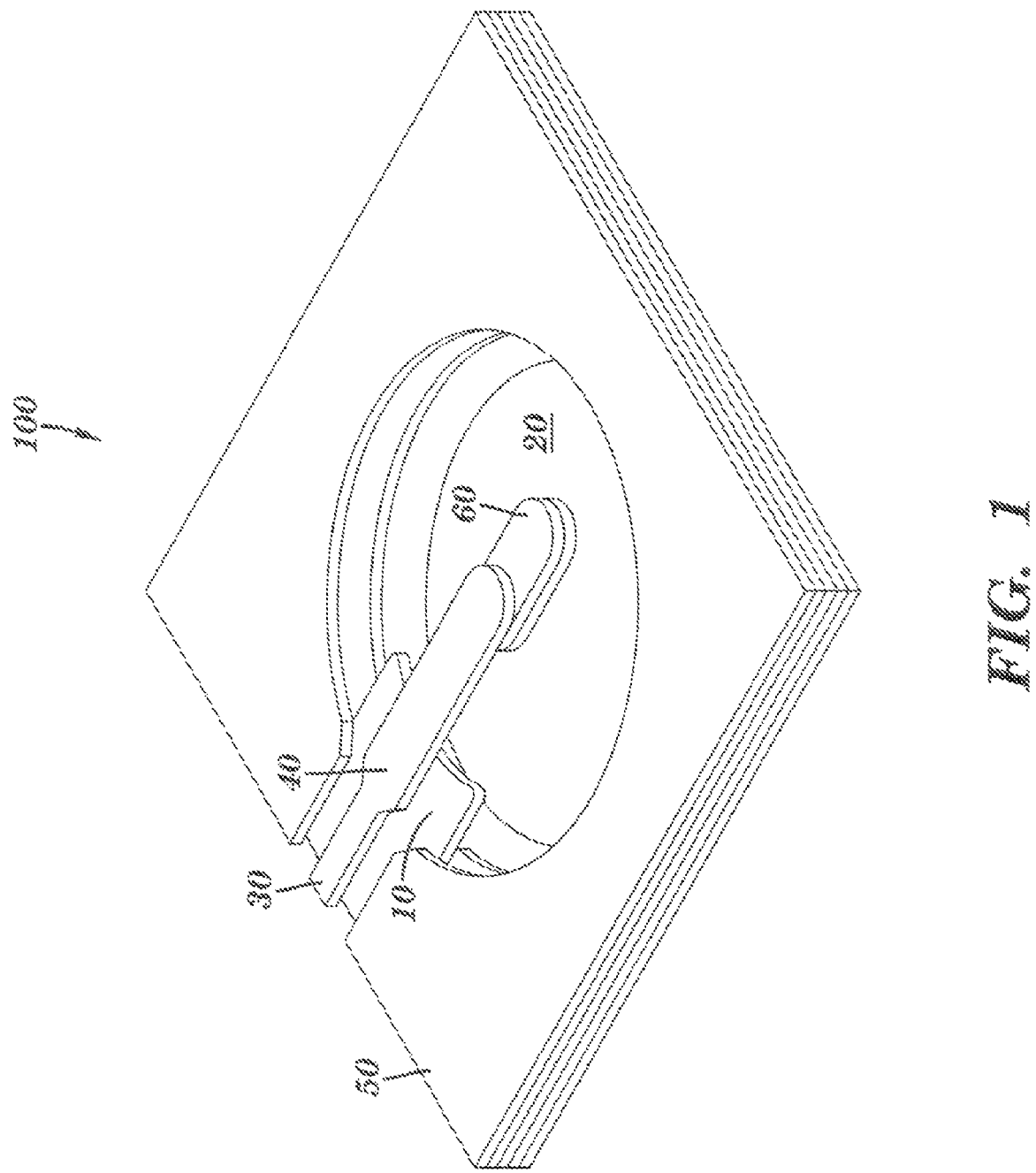

IBM® is a registered trademark of International Business Machines Corporation, Armonk, N.Y., U.S.A. Other names uses herein may be registered trademarks, trademarks or product names of International Business Machines Corporation or other companies.

BACKGROUND

Exemplary embodiments relate to preventing cracks in electronics, and particularly to protecting traces against cracking.

In microelectronics, the ball grid array (BGA) is replacing pin grid array (PGA). The BGA descended from the pin grid array (PGA), which is a package with one face covered (or partly covered) with pins in a grid pattern. These pins are used to conduct electrical signals from the integrated circuit that it is placed on top a printed circuit board (PCB). In a BGA, however, the pins are replaced by balls of solder stuck to the bottom of the package (device). The device is placed on a PCB that carries copper pads in a pattern that matches the solder balls. The assembly is then heated, either in a reflow oven or by an infrared heater, causing the solder ball to melt. Surface tension causes the molten solder to hold the package in alignment with the circuit board, at the correct separation distance, while the solder cools and solidifies. Many devices now utilize the BGA in the assembly process.

For example, FCPBGA (Flip Chip Plastic Ball Grid Array) substrates are typically constructed from multiple layers of copper circuitry separated by organic dielectrics. These build-up layers of circuitry and dielectric are deposited on either side of a fiber reinforced resin core. The fibers in the core are typically in the form of woven glass cloth, although non-glass and/or non-woven fiber reinforcements are also used in the industry. The build-up dielectrics are typically based on organic resins typically do not contain fiber reinforcements, but do not contain inorganic and organic filler particles to reduce the coefficient of thermal expansion (CTE). Since the build up dielectrics do not contain fiber reinforcement, they are prone to crack initiation and propagation when subjected to cyclic tensile strains. Such cyclic tensile strains result from the bonding together of materials with widely differing CTEs within the laminate substrate and assembled module. Typical materials of construction are Cu(CTE=~17 ppm/° C.), core dielectric (CTE=~12 to 20 ppm/° C.), silicon (CTE=~3 ppm/° C.), and build-up dielectric (CTE=~45 to 90 ppm/° C.). During thermal cycling the materials try to expand and contract at different rate, but because they are bonded together in a layered structure, the expansion and contraction of each material is constrained by other materials, resulting in strains within the materials. Under some conditions these strains have been observed to cause cracking of the build-up dielectrics.

In FCPBGA packages, dielectric cracks are often initiated at the periphery of the Cu BGA pads on the bottom surface of the module, and propagate essentially perpendicular to the major plane of the structure. Crack propagation slows or terminates when the crack reaches a layer that is more resistant to cracking than the build-up dielectric. This crack interrupting layer is usually either a large planar area of Cu or the fiber reinforced core dielectric. In extreme cases, there is sufficient strain energy to cause crack propagation through either large areas of Cu or into the core dielectric.

In microelectronics, traces (lines) need to be protected against cracking. As mentioned above, the cracking is usually propagated in the laminate and initiated from the ball grid array (BGA), and thus, without protection, the traces can be broken.

Therefore, features are needed to protect traces from cracking in microelectronics.

SUMMARY

In accordance with exemplary embodiments, a microelectronic package having integrated circuits is provided. The microelectronic package include multiple dielectric laminate layers, copper circuitry between the dielectric laminate layers where the copper circuitry includes circuit traces, and ball grid arrays/land grid arrays operatively connected to the copper circuitry such that conduction occurs.

According to one aspect, proximate to the connection of the copper circuitry and the ball grid arrays/land grid arrays, a protective copper tongue is below an extension of the circuit traces, such that the protective copper tongue prevents the circuit traces from being affected by cracking propagated in the dielectric laminate layers or the ball grid arrays/land grid arrays.

According to another aspect, as the circuit traces extend in a longitudinal direction, the circuit traces are flared at an angle in a width direction, and the circuit traces narrow in the width direction toward the distal end thereof. Also, the circuit traces have a widened circular portion at the distal end.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION IF THE DRAWINGS

Figure 2C:
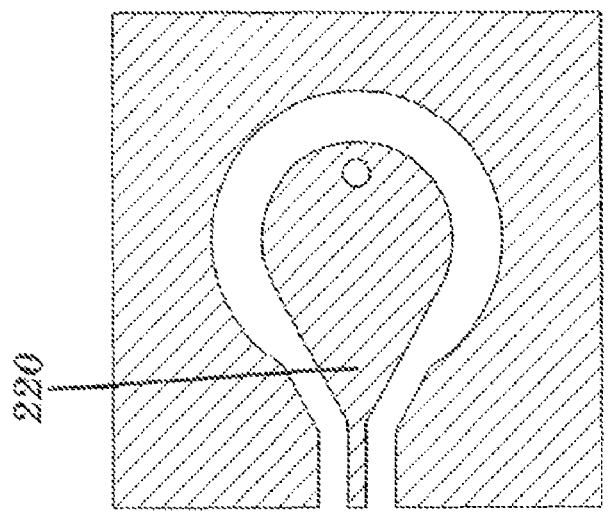
Figure 2B:
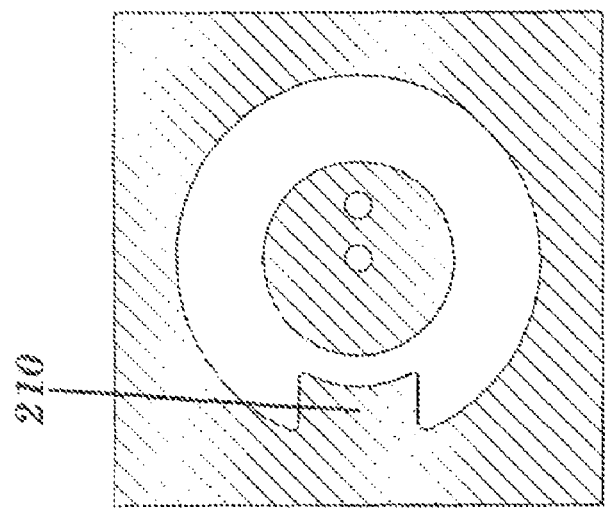
Figure 2A:
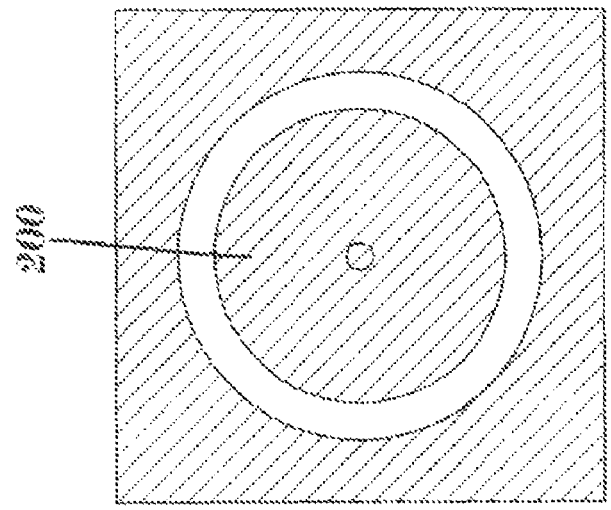
Figure 3:
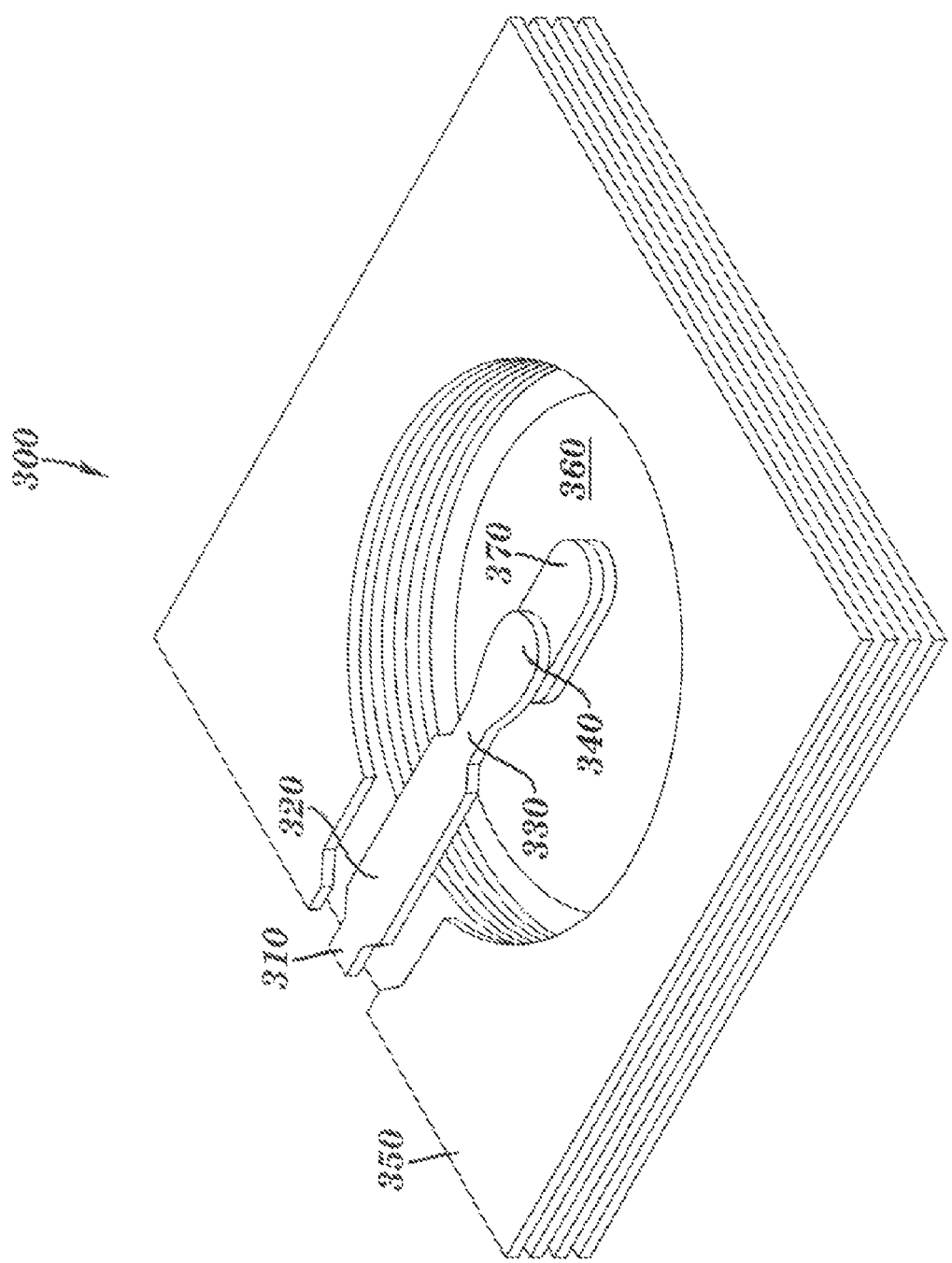

The subject matter which is regarded as the invention is particularly pointed out and distinctly claimed in the claims as the conclusion of the specification. The foregoing and other objects, features, and advantages of the invention are apparent from the following detailed description taken in conjunction with the accompanying drawings in which:

FIG. 1 illustrates an apparatus for crack prevention in accordance with one aspect;

FIGS. 2A, 2B, and 2C illustrate BGA layers of an apparatus for crack prevention in accordance with another aspect; and FIG. 3 illustrates an apparatus for crack prevention in accordance with another aspect.

The detailed description explains exemplary embodiments and aspects of the invention, together with advantages and features, by way of example with reference to the drawings.

DETAILED DESCRIPTION

In accordance with exemplary embodiments, FIG. 1 illustrates an apparatus 100 having a copper (Cu) feature (tongue 10 or copper plane) which is wide enough to be an effective crack stop, on a layer between a BGA pad 20 and layer on which the trace 30 connecting to the BGA pad 20 is routed. Although copper is discussed herein, the use of copper is not meant to be limiting but is for exemplary purposes.

FIG. 1 illustrates a structure that is an extension of a filled area (Cu plane) that overlaps the edge of the BGA pad 20. This extension is referred to as a tongue 10. This localized are of Cu overlapping the BGA pad 20 is much smaller than the overlap area if the entire periphery of the BGA pad was overlapped. As such, this localized area has a much lower parasitic capacitance, and thus better high frequency signal integrity. This structure of the tongue 10 may have various representations, shapes etc., and is not meant to be limiting.

Trace 30 include a flared trace 40 with a wider width than trace 30, and the wider width extends along the longitudinal axis to the distal end of trace 30. The wider width of the flared trace 40 helps prevent the propagation of cracks.

Apparatus 100 includes dielectric laminate layers 50 (build-up dielectrics), and oval pads 60. Those skilled in the art understand the various bonding and connecting techniques of integrated circuits (and microelectronic circuit packages) having dielectric laminate layers 50, traces 30, ball grid arrays (BGA pad 20), and oval pads.

As discussed herein, the trace 30 can have increased width (flared trace 40 as shown in FIG. 1), and/or a large tongue and teardrop like flare (as shown in FIGS. 2A, 2B, and 2C) to provide additional Cu width in the at risk region in order to further reduce the probability of trace breakage due to a propagating dielectric crack.

FIGS. 2A, 2B, and 2C illustrate BGA layers of an apparatus according to one aspect. FIGS. 2A, 2B, and 2C illustrate a BGA pad 200 on BGA layer 1, and a tongue 210 on BGA layer 2, and a teardrop like flared trace 220 on BGA layer 3. The BGA layers 1-3 are operatively combines or connected to form an apparatus that provides crack prevention for the trace.

FIG. 3 illustrates an apparatus according to another aspect. The apparatus 300 in FIG. 3 eliminates the tongue feature (shown in FIGS. 1, 2A, 2B, and 2C), and relies on an increased width (flared trace 320) of the trace 310 in the region at risk for crack initiation and propagation. The trace 310 has the flared trace 320, and as the trace 310 extends in the longitudinal direction, it reduces in width at neck 330. The neck 330 is connected to another flared portion (wider area) that is located at the distal end 340 of the trace 310. Apparatus 300 also includes dielectric laminate layers 350, ball grid arrays BGA pad 360), and oval pads 370.

Also, as seen in FIG. 3, although no tongue is provided, the flared trace 310 begins to widen earlier that in FIGS. 1, 2A, 2B, and 2C.

This apparatus 300, having the flared trace 320, is a structure that is useful for very high-speed nets, where even the reduced parasitic capacitance of a tongue structure is still too large for proper circuit operation.

In accordance with exemplary embodiments, for the highest speed nets, where parasitic capacitance must be minimized to the greatest extent possible, high-speed net traces may be widened only where it does the most good in resisting propagation of resin cracks. This structure is centered over the tongue and is only long enough to account for registration tolerances, layer to layer issues as a result of manufacturing, as well as the lateral extent of resin crack propagation form the edge of the tongue structure.

Calculations indicate that a typical structure with a BSM-1 reference plane layer closed in around the signal via stack over a 620 um dia pad may have 0.3 pF of pad to reference plane capacitance. For signal rates at 3.2 Gbps, the 5th harmonic will be at 8 GHz, so that the shunt impedance this capacitance represents is about $-j67$ ohms, which will have a significant impact on the signal with the bulk of the signal path having a characteristic impedance around 50 ohms (even the 3rd harmonic is $-j110$ ohms).

In accordance with exemplary embodiments, however, the insertion capacitance with the most aggressive tongue and flared structure disclosed herein will only have about a tenth of that parasitic signal to reference plane capacitance. As such, signals see (perceive) significantly less reflections and higher signaling.

The structures discussed herein are not limited to a ball array and are applicable to a land grid array (LGA) or LGA socket, which is a physical interface for microprocessors. The LGA permits direct electrical connection between a module substrate and a circuit board. LGA connectors allow an interconnection between mating surfaces of a module or other area array device and a printed circuit board by using a conductive interposer. Connection is achieved by signaling the contact array of the two mating surfaces and the interceptor, and mechanically compressing the interposer.

The capabilities of the present disclosure can be implemented in software, firmware, hardware or some combination thereof.

As one example, one or more features of the present disclosure can be included in an article of manufacture (e.g., one or more computer program products) having, for instance, computer usable media. The media has embodied therein, for instance, computer readable program code mean for providing and facilitating the capabilities of the present disclosure. The article of manufacture can be included as a part of a computer system or sold separately.

While the exemplary embodiments and aspects of the invention have been described, it will be understood that those skilled in the art, both now and in the future, may make various improvements and enhancements which fall within the scope of the claims which follow. These claims should be constructed to maintain the proper protection for the invention first described.

What is claimed is:

1. A microelectronic package having integrated circuits, comprising:
    multiple dielectric laminate layers;
    copper circuitry between the dielectric laminate layers, the copper circuitry comprising circuit traces;
    wherein the circuit traces begin beyond ball grid array pads, extend in a longitudinal direction from between the dielectric layers, and end over the ball grid array pads;
    wherein a protective copper tongue is below an extension of the circuit traces;
    wherein the protective copper tongue begins beyond the ball grid array pads, extends in the longitudinal direction parallel to the circuit traces, and ends over the ball grid array pads;
    wherein a width of the circuit traces directly over the protective copper tongue edge is widened; and
    wherein the end of the protective copper tongue over the ball grid array pads is curved in a width direction.

2. The microelectronic package of claim 1, wherein the width of the circuit traces is flared as the circuit traces extend in a longitudinal direction, and the flaring of the circuit traces starts at a portion of the circuit traces that is above the protective copper tongue.

3. The microelectronic package of claim 1, wherein the protective copper tongue is a plane-like structure.

4. The microelectronic package of claim 1, wherein the circuit traces are flared in the width direction like a teardrop.

* * * * *